United States Patent [19]
Ziegler, Jr. et al.

[11] Patent Number: 5,627,746
[45] Date of Patent: May 6, 1997

[54] LOW COST CONTROLLER

[75] Inventors: Eldon W. Ziegler, Jr., Clarksville; Dexter Smith, Columbia; Michael P. McLoughlin, Sykesville, all of Md.

[73] Assignee: Noise Cancellation Technologies, Inc., Linthicum, Md.

[21] Appl. No.: 367,292

[22] PCT Filed: Jul. 14, 1992

[86] PCT No.: PCT/US92/05772

§ 371 Date: Mar. 1, 1995

§ 102(e) Date: Mar. 1, 1995

[87] PCT Pub. No.: WO94/01810

PCT Pub. Date: Jan. 20, 1994

[51] Int. Cl.$^6$ .................... G05B 13/02; G06F 17/00
[52] U.S. Cl. .................. 364/148; 364/176; 364/724.2; 381/71
[58] Field of Search .................. 364/148, 724.01, 364/724.19, 724.2, 176, 825; 381/71, 94

[56] References Cited

U.S. PATENT DOCUMENTS

| | | | |
|---|---|---|---|
| 4,566,118 | 1/1986 | Chaplin et al. | 381/71 |
| 4,649,505 | 3/1987 | Zinser, Jr. et al. | 381/71 X |
| 4,878,188 | 10/1989 | Ziegler, Jr. | 364/724.01 |
| 5,105,377 | 4/1992 | Ziegler, Jr. | 364/724.01 |
| 5,219,037 | 6/1993 | Smith et al. | 364/724.01 |

*Primary Examiner*—Joseph Ruggiero

[57] ABSTRACT

A simple, low cost active noise cancellation system employing a delay and actuator estimator (35), a gain determination (34), a gain (33) and speaker (36) that cancels stationary random noise such as that encountered on a rangehood fan.

16 Claims, 8 Drawing Sheets

LOW COST CONTROLLER

This invention relates to a low cost active noise cancellation system. It was designed by the need for very low cost electronics in using active noise cancellation for quieting small fans, refrigerators and other extremely cost sensitive applications. The instant invention has the ability to cancel stationary random noise such as that encountered on a rangehood fan or tonal noise. The "plant" of the operation, i.e., the speakers, enclosure, microphone and the configuration itself has to be of a certain design so as to minimize delays which interfere with the plants ability to produce a cancellation signal. These delays are the result of the response of the loudspeaker, its cabinet and the transit time between speaker and microphone. While repetitive compensating techniques can be used in repetitive noise, they don't work with random noise. This invention contemplates employing strict design criteria in designing the "plant" and using equalizing filters. The equalization filter allows for a relaxation of the strict time delay requirements. A filter is used to produce an estimate of the noise by subtracting the predicted effects of the cancellation signal from the residual signal. For tonal cancellation the equalization filter is used to add additional delays at frequencies where needed, for instance where the plant delay is too long to meet the requirements for random cancellation, in order to meet an earlier cycle of the tonal noise. For random cancellation the equalization filter minimizes the mean-square error resulting from twin delays in the system.

Figure 12:
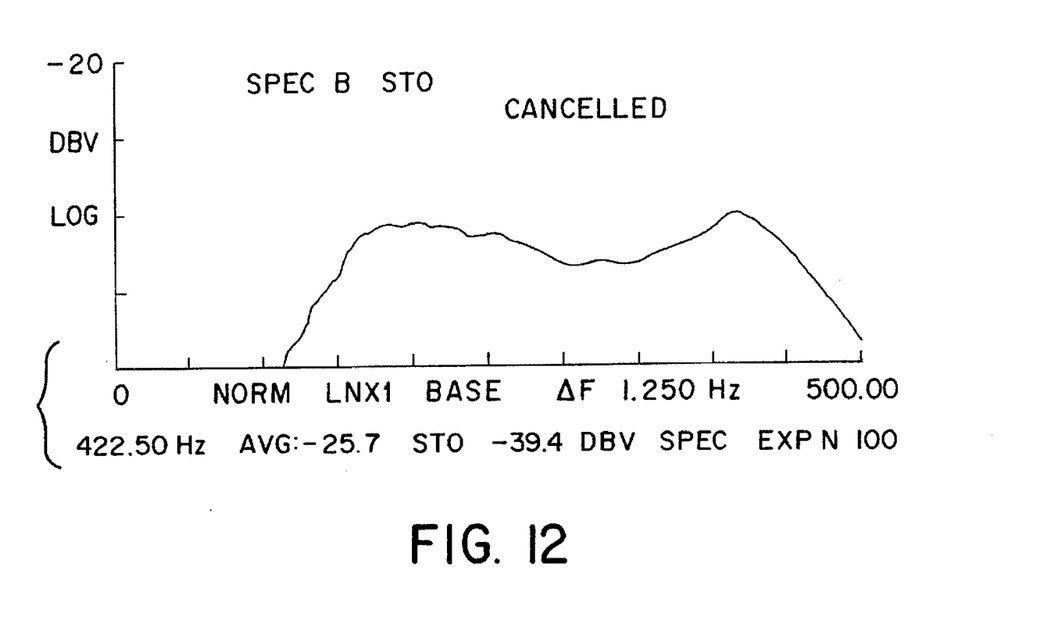
FIGS. 12 and 13 show the results of fan noise cancellation with DVE cancellation On and Off.
Figure 13:
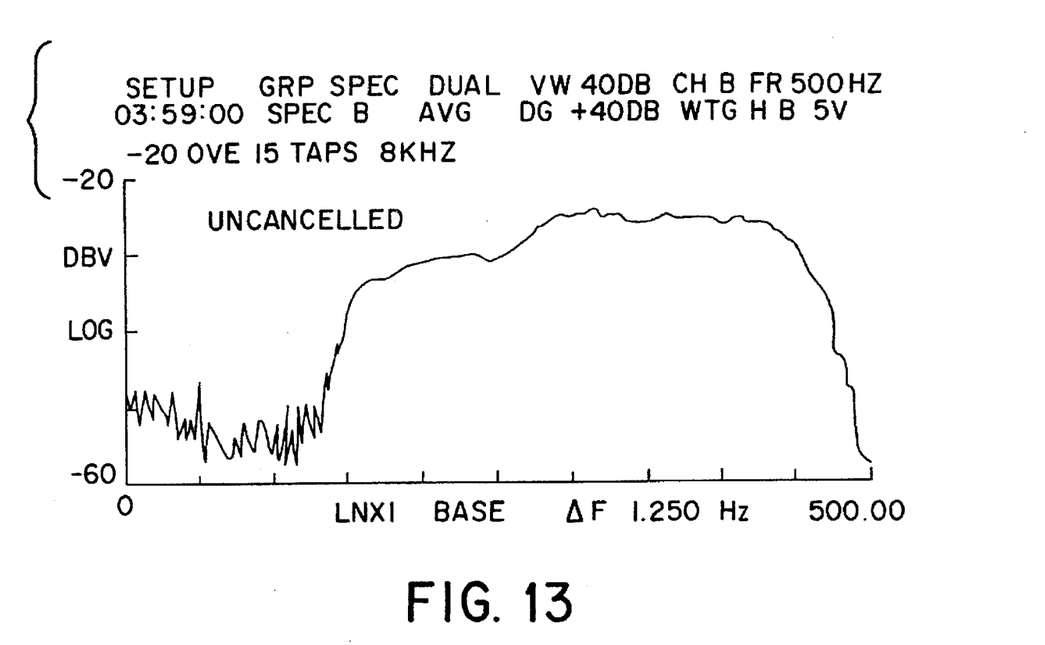

The DVE (digital virtual earth) system disclosed in U.S. Pat. No. 5,105,377 can, with a dozen or so taps, cancel band limited random noise if plant delays are small enough. This has been done by canceling random noise limited between 150 Hz to 450 Hz shown in the charts of FIGS. 12 and 13 herein. The adaptive FIR filter of DVE can be replaced by a single inverting amplifier with adjustable gain under appropriate plant criteria. Thus a small, low cost canceller consists of a single filter to predict the effects of the cancellation signal on the residual signal enabling the feedback to be electronically subtracted. An inverting amplifier with adjustable gain is used and, possibly, an equalization circuit is used to compensate for delays in the plant that are too long for random cancellation when applying the device to tonal cancellation. The DVE feedback filter can be replaced with a simple delay resulting in a cancellation system including equalization that requires only a single filter.

Accordingly it is an object of this invention to provide an active noise cancellation plant system that can cancel band limited random noise.

Another object of this invention is to provide a low cost active noise cancellation system.

A further object of this invention is to provide an active noise cancellation system that can cancel tonal noise.

These and other objects will become apparent when reference is had to the accompanying description and drawings in which.

Plant delays prevent an active cancellation system from using perfect knowledge of the noise to produce the cancellation signal. Plant delays in acoustic systems often result from the response of the loudspeaker, its cabinet and the transit time between the speaker and microphone. These delays can be compensated for when canceling repetitive noise. However, these repetitive compensating techniques do not work with random noise.

Insight into the effects of plant delays on random noise cancellation and the resulting optimum plant design can be obtained from an analysis of a simple active canceller in which the noise is known and is sinusoidal but use is not made of sinusoidal compensation techniques.

The Active Canceller Model

When the noise is known a simple active canceller can be used consisting of an inverting amplifier with adjustable gain. If the noise is $$n(t)=\sin(\omega t), \qquad \text{Eq. (1)}$$

where $\omega$ is the frequency in radians per second, then the optimum cancellation signal is $$c(t)=-A|H|\sin(\omega t - wt_d) \qquad \text{Eq. (2)}$$

where A is the gain, $|H|$ is the magnitude of the plant response at frequency $\omega$ and $t_d$ is the plant delay, in seconds, at frequency $\omega$. The residual signal is $$r(t)=\sin(\omega t)-A|H|\sin(\omega t-\omega t_d) \qquad \text{Eq. (3)}$$

and the average power of the residual is given by $$P=0.5[1-2A|H|\cos(\omega t_d)+A^2|H|^2] \qquad \text{Eq. (4)}$$

Plant Design Requirements

Taking the partial derivative of equation 4 with respect to A and solving; the optimal value of A is $$A_{opt}=\frac{\cos(\omega t_d)}{|H|} \qquad \text{Eq. (5)}$$

Note that the optimal gain depends on the frequency, the amount of delay and the magnitude of the frequency response. In order for $A_{opt}$ to be independent of frequency the right hand side of equation 5 must be constant. If the plant has a flat frequency response the product $\omega t_d$ must be constant. This implies that the phase decreases proportionately to the log of the frequency.

The amount of cancellation is computed by dividing by the power of the original signal (0.5) giving $$dB=10 \log [1-2A|H| \cos (\omega t_d)+A^2|H|^2]  \quad \text{Eq. (6)}$$

or $$dB_{opt}=10 \log \sin^2(\omega t_d)  \quad \text{Eq. (7)}$$

with a flat frequency response

Figure 14:
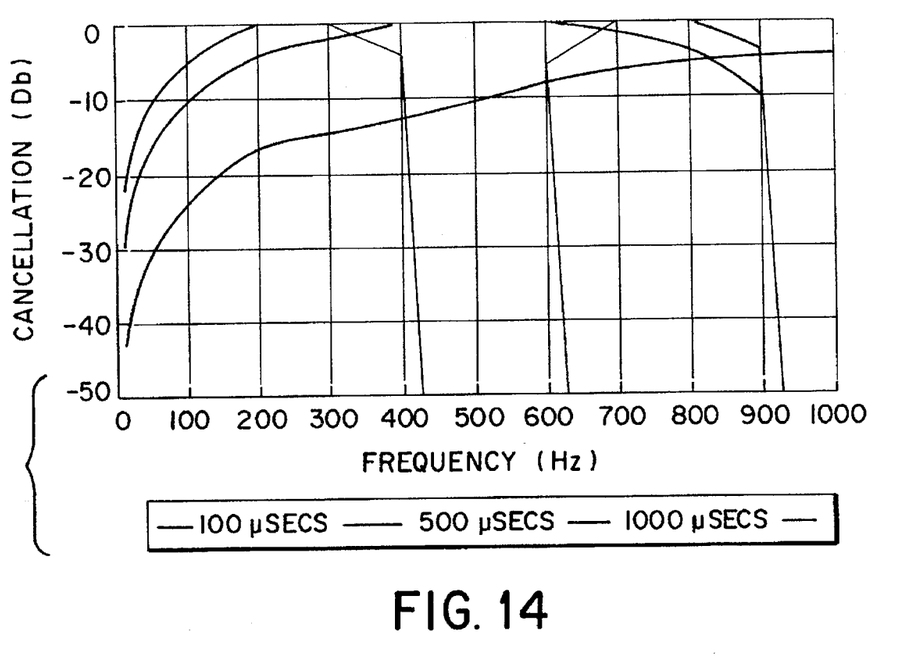
FIGS. 14 and 15 shows the amount of cancellation without equalization plotted for various frequencies and time delays.
Figure 15:
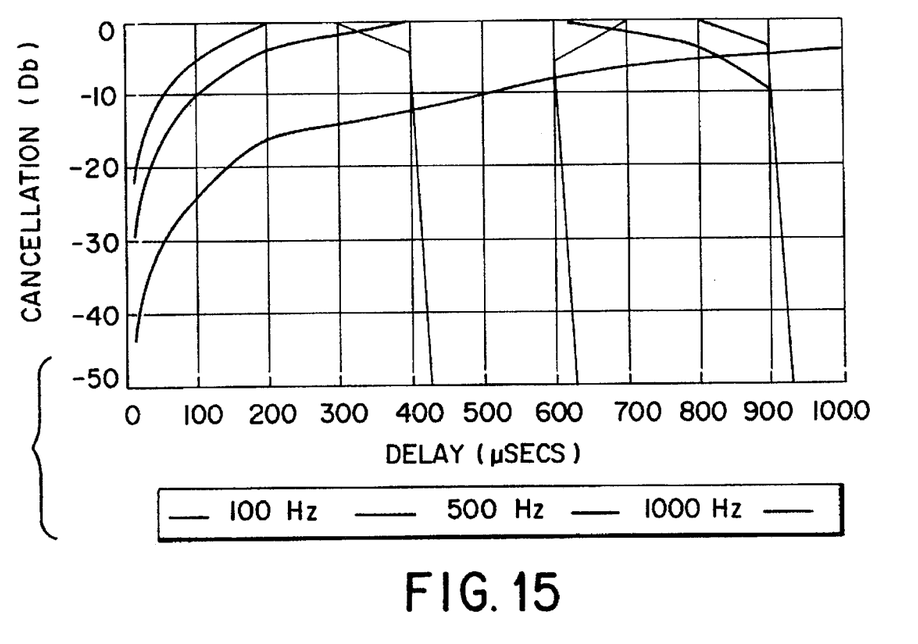

In FIGS. 14 and 15 the amount of cancellation is plotted for various frequencies and time delays. The plots are, of course, the same with frequency and delay interchanged since the amount of cancellation depends on the product of the two. Note that complete cancellation of the sinusoidal noise is obtained whenever the product of the frequency, in Hz, and the delay, in seconds, is an integer multiple of 0.5 cycles.

Figure 16:
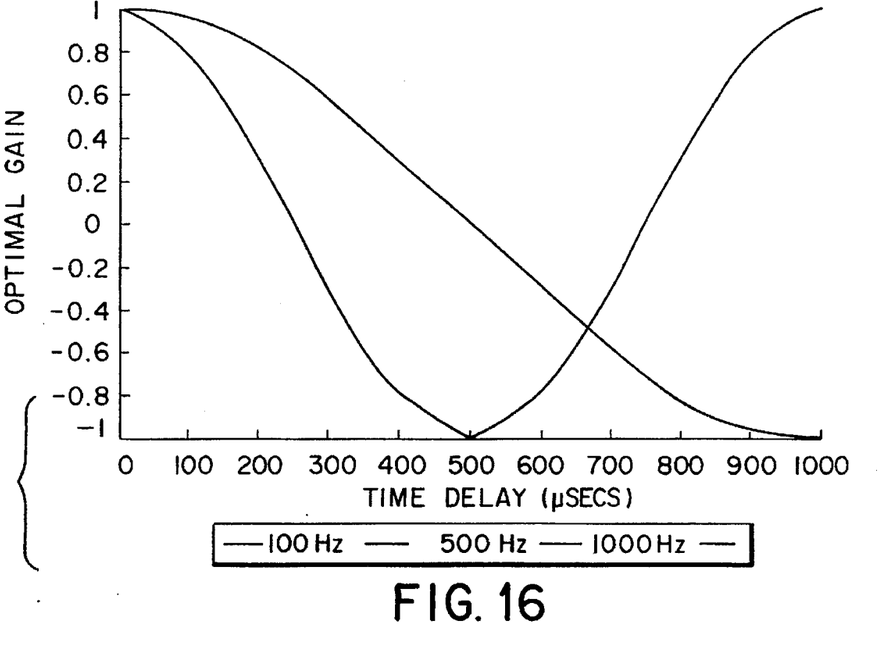
FIG. 16 shows the value of Aopt without equalization for various frequencies and time delays.

The value of $A_{opt}$ is shown for various frequencies and time delays in FIG. 16. Again, the values of frequency and time delay can be interchanged. When either the frequency or time delay is low, e.g., 100 Hz or 100 μsecs, the optimal gain is relatively independent of the other variable. However, when both increase the optimal gain can swing from +1 to −1.

Figure 17:
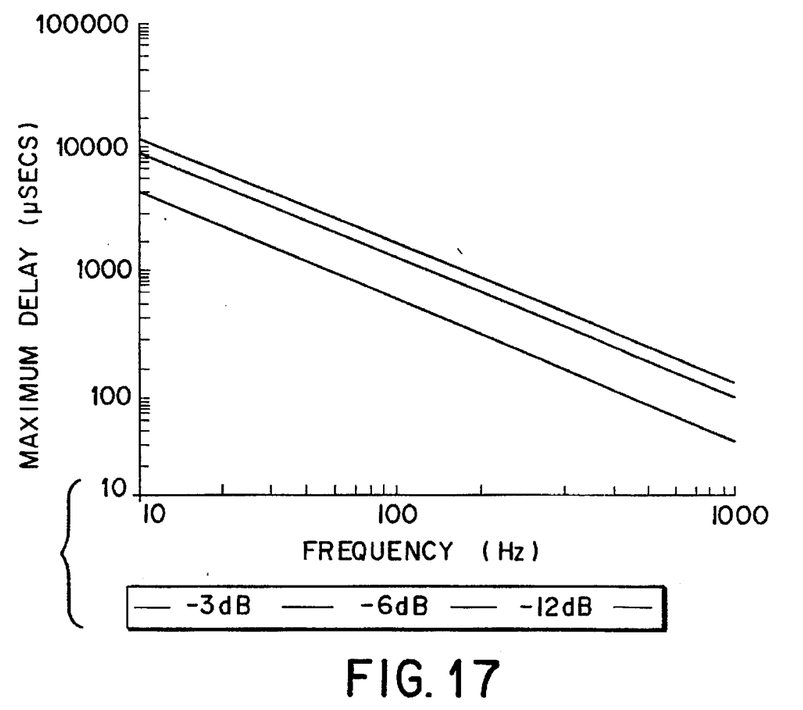
FIG. 17 shows the plot of solving for maximum plant delay at various frequencies.

A feel for the implications of these results can be obtained by solving for the maximum plant delay at various frequencies for selected amounts of cancellation. These are listed in table 1 and shown in FIG. 17 using optimal gain.

TABLE 1

| | Maximum Delay vs Frequency and Minimum Cancellation | | |
|---|---|---|---|
| | | Maximum Delay (μsecs) | |
| Frequency (Hz) | 3 dB Cancellation | 6 dB Cancellation | 12 dB Cancellation |
| 100 | 1,253 | 836 | 404 |
| 500 | 251 | 167 | 81 |
| 1000 | 125 | 84 | 40 |

A specification for the plant design can be obtained by the use of equations 5 and 7. In order to have constant gain with a flat frequency response the product $\omega t_d$ must be constant; call it K.

$$K=\omega t_d \quad \text{Eq. (8)}$$

The value of K can be determined by selecting a desired amount of cancellation and applying equation 7 as follows:

$$K = \sin^{-1}\left[ \log^{-1}\left[ \frac{dB_{des}}{20} \right] \right] \quad \text{Eq. (9)}$$

Table 2 show the values of K and the resulting gains for 3 dB, 6 dB and 12 dB of cancellation.

| Cancellation | K | A |
|---|---|---|
| 3 dB | 0.787 | 0.71 |
| 6 dB | 0.525 | 0.87 |
| 12 dB | 0.254 | 0.97 |

Applying equation 8 gives the required delay at each frequency. Solving the equation $$td = -\frac{d\theta}{d\omega} \quad \text{Eq. (10)}$$

for phase provides the required phase response

$$\theta=-K1n(\omega) \quad \text{Eq. (11)}$$

Figure 18:
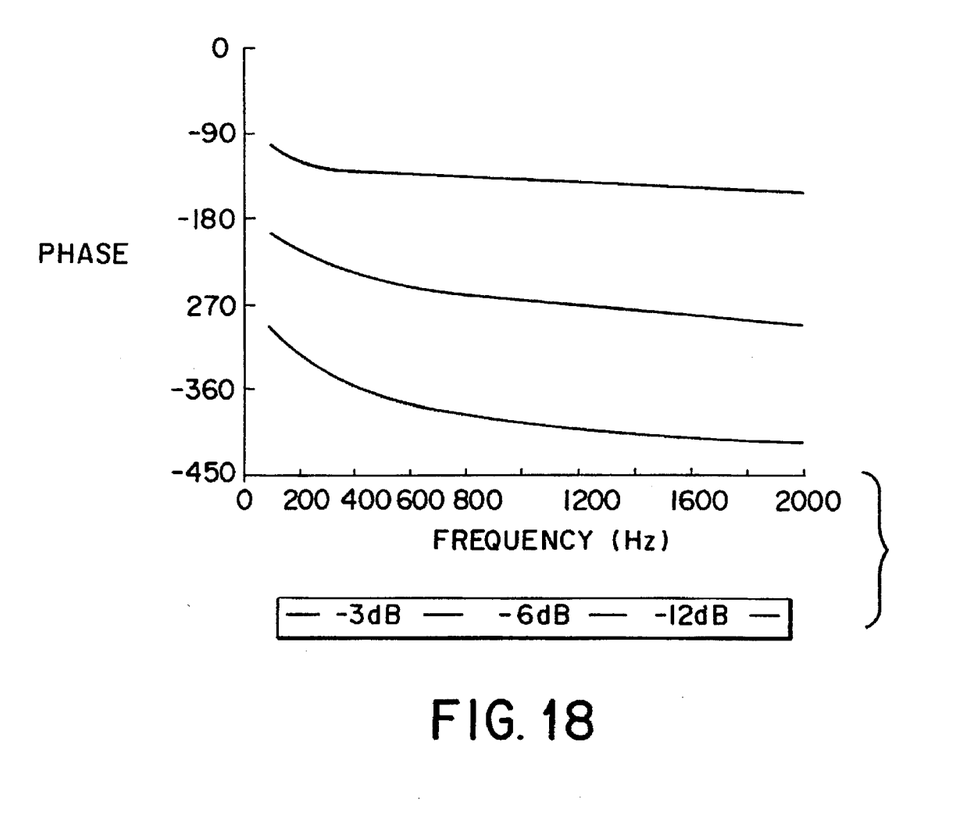
FIG. 18 shows the required phase response for three different levels of cancellation.

FIG. 18 shows the required phase response for three different levels of cancellation. The phase response for the required amount of cancellation and flat magnitude frequency response provide the specification for the optimum plant.

This analysis applies a random cancellation technique to sinusoidal noise in order to assess the effects of time delays in the plant. Relationships are derived that determine the optimal gain and the amount of cancellation for various combinations of frequency and plant delay. The maximum plant delay allowable in order to achieve certain cancellation goals is tabulated. Design rules are presented to determine the optimum plant response.

EQUALIZING FILTER

The low-cost noise cancellation system consists of a microphone, a speaker and signal processing to minimize the noise at the microphone. The speaker is modeled as a discrete transfer function h(z) along with a discrete time delay z^−d of d samples. The basic system is as follows:

The canceling signal appears at 1. This signal goes through the time delay and speaker to be mixed with the noise n. It also goes through an FIR estimate of the speaker h(z) with the appropriate time delay. This configuration results in the canceling signal being subtracted from the noise n before the inversion block. Thus, the noise n itself is inverted and outputs as the canceling signal.

The problem with this configuration is the canceling signal phase shift caused by both the time delay d and the speaker h(z). For a low cost canceller it is counter productive to design in predictors to predict the noise d samples into the future. Rather it was initially thought to compensate the canceling signal at point 1. The form of this compensation would be one over the estimate of h(z). Nothing can be done about the delay other than increasing the sampling rate to minimize its effects. Here, two filters along with A/D's and D/A's are needed.

This invention contemplates a configuration that compensates for the phase shifts in the speaker but needs only one filter and associated hardware. The compensation here consists of the inverse estimate of the speaker. Here the canceling signal is sent to the speaker and the time delay feedback function. The signal is degraded by the speaker and then has noise added to it. This resultant signal is then compensated. This output is added to the negated, delayed only canceling signal. The result is n only going to the inverter as before.

Figure 1:
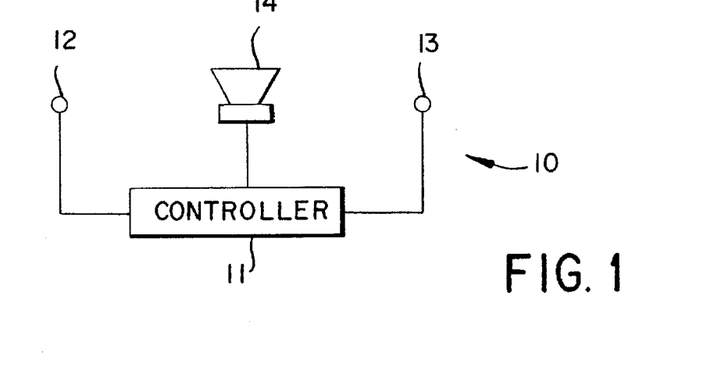
FIG. 1 shows a circuit diagram of a basic standard controller set.
Figure 2:
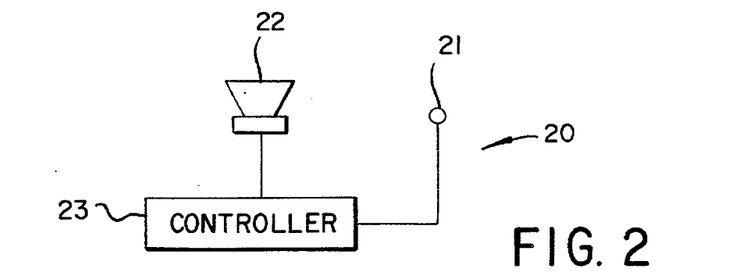
FIG. 2 shows a circuit of a basic controller simplified per this invention.

Many cancellation schemes have been developed such as that in FIG. 1 denoted as 10 which uses a reference microphone 12, a speaker actuator 14, controller 11 and an error microphone 13. A substantial amount of signal processing including adaptive filtering is done in the processor. A simplification to this scheme is seen in FIG. 2 at 20. Here, one error microphone 21 and actuator 22 along with controller 23 having the necessary signal processing duel adaptive filtering are required. However, even with pretraining two of the adaptive filters, one multiweight adaptive filter is constantly having its weight values updated which still involves a nontrivial amount of signal processing.

Low Cost Controller Derivation

Figure 3:
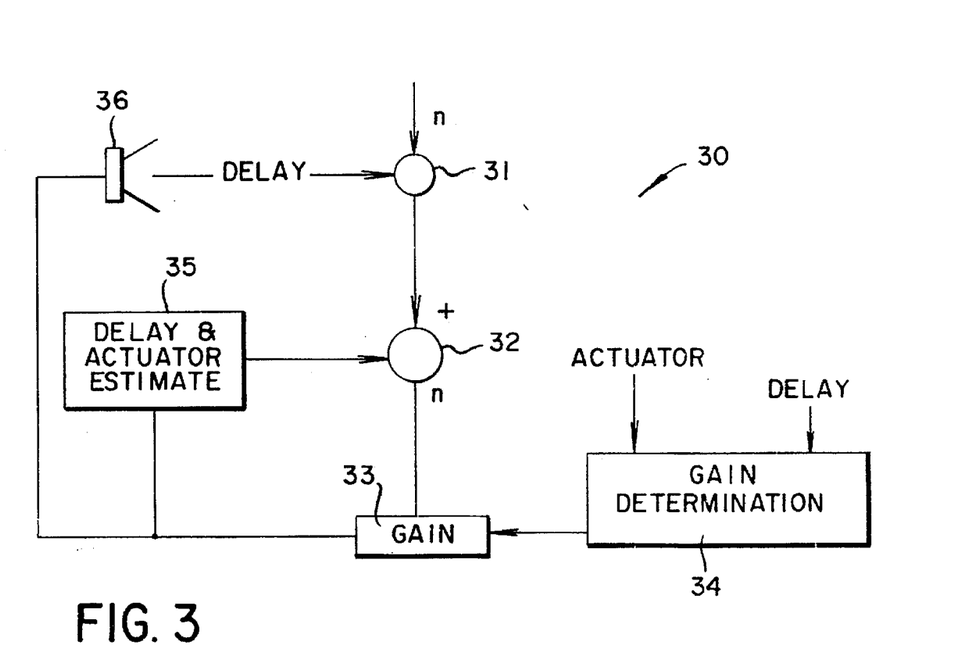
FIG. 3 is a circuit diagram showing a basic/weight optimum filter circuit.

The new system is a simplified solution of an optimum Weiner filter with a single gain inversion process that is calculated with a knowledge of the input noise statistics and the plant characteristics. This system is seen in FIG. 3 as 30 with a feedback filter (an estimate of the delay and plant characteristic) to subtract out the effect of the canceling signal. It has Gain Determinator 34, actuator 36, input 31, summing module 32, the gain 33, delay and actuator estimate and actuator 35. Thus, the residual is simply the resultant noise following cancellation. Note that the feedback filter is dependent only on the delay and actuator and needs to be determined only once, such as with a white noise training signal.

The feedback filter is the impulse response of the actual actuator with delay included and can be measured experimentally with an analyzer.

The optimum filter is a realization of the well known projection theorem found in many stochastics processes texts. Note that this filter is possible only with the perfect subtraction of the canceling signal. It can be shown that the optimum gain is such a filter is $$\text{gain opt} = <u,n>/<u,u>$$

Where n is the input noise to be canceled and u is that noise filtered through the delay and actuator. <> is expectation and the gain equation reduces to gain opt=cross correlation of n and filtered n at delay divided by the auto correlation of filtered n Therefore, the primary disadvantage to the low cost scheme is readily apparent—the transport delay can cause the optimum gain to be so low as to effect no cancellation of n. However, given a reasonable delay, say 2 sample periods, cancellation can be effected if the cross correlation at 2 is not too small. So, white noise cannot be canceled with this scheme but correlated signals, especially those whose frequency is much less than the digital sampling frequency can be significantly reduced.

Equalization of Plant

Figure 4:
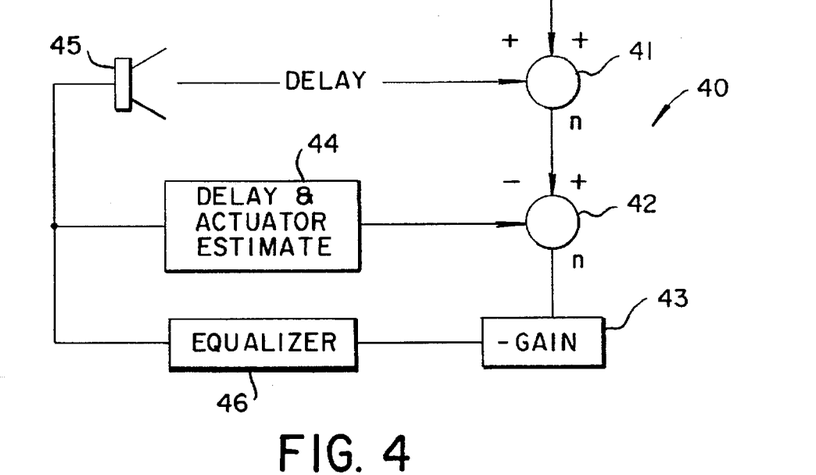
FIG. 4 is a circuit diagram showing a weight optimum filter with an equalizer.

An improvement to the new system is realized with an equalizer placed after the gain block as in FIG. 4 as 40 having modules input 41, summer 42, gain 43, equalizer 46, delay and actuator estimator 44 and actuator 45.

The equalizer 46 is determined analytically or adaptively (such as with a white noise training signal). A conventional equalizer would be trained so that the convolution of the equalizer and actuator is an impulse. However, for this control system application, the resulting delay is unacceptable. So, given an impulse response of interest, the equalizer is trained to produce the correct phase shift at frequencies of interest. As with a feedback filter, the equalizer is dependent only on the actuator and need be determined only once for a given plant. Thus the signal processing is reduced to two filters only with no filter weight adaption processing necessary during operation.

Figure 5:
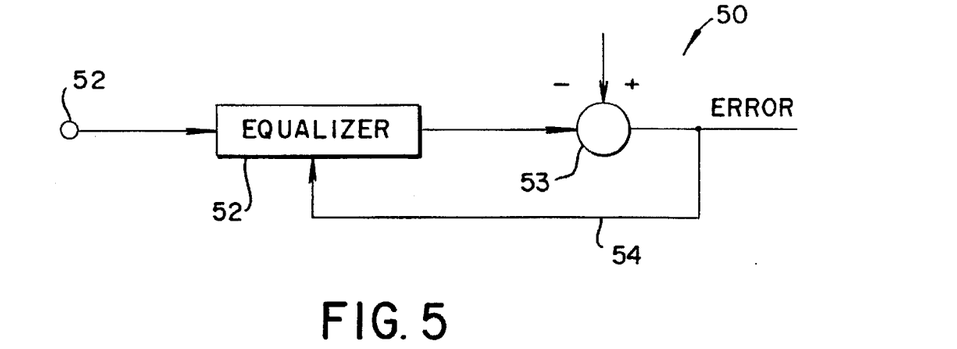
FIG. 5 is illustrative of a circuit showing equalizer training position.

This unique equalizer is trained as in FIG. 5. The input is the set of frequencies to be corrected. The frequency response of the plant will give the phase shift and magnitude response through the plant. Then determine the frequencies to be equalized (from a knowledge of the noise to be canceled) and construct the input to the training process. Additional emphasis may be given to the specific frequencies of interest by increasing their relative magnitude going into the equalizer. Note also that frequencies that should not be canceled such as voice or alarms may have their phases shifted so as to add constructively at the microphone and ensure their being heard.

This scheme in FIG. 4 works well but requires two sets of A/D's and D/A's to support the two digital filters. An alternative scheme was devised to further reduce the hardware requirements in this low cost canceling approach.

Single Filter Equalization

Figure 6:
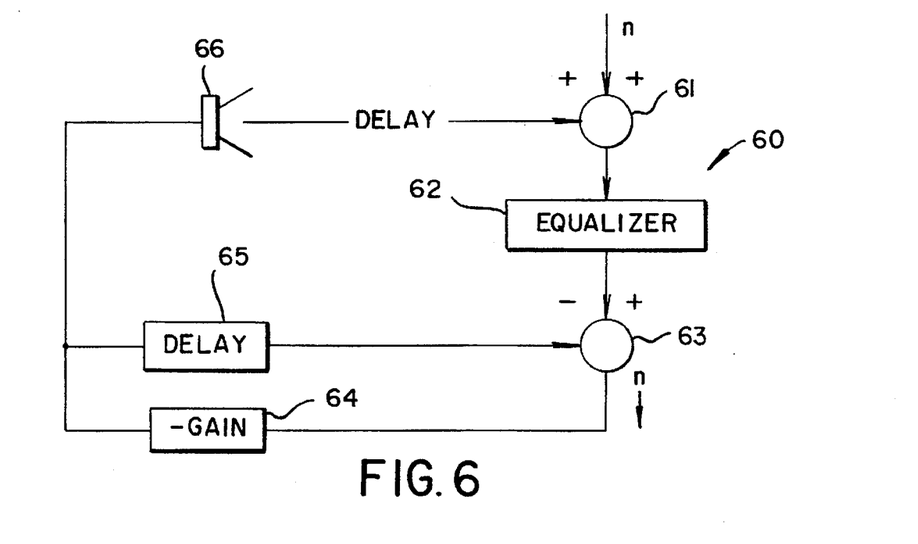
FIG. 6 is a diagram showing an alternate equalizer position.

A further improvement in the way of hardware reduction is seen in FIG. 6 as 60 with modules input 61, summer 63, equalizer 62, gain 64, delay only 65 and actuator 66.

Here, the equalizer 62 is placed after the microphone and before the subtraction of the canceling signal. The feedback filter is reduced to a delay only; the equalizer 62 produces the corrected version of the canceling signal still incorporating the delay at the feedback cancellation point. Therefore, only one digital filter with a simple delay feedback filter is needed in this low-cost implementation.

Training the equalizer is identical to the two filter canceller above and the equalizing filter produced is identical. Note that the residual before the gain inverter is now not the noise itself but an equalized version of the noise. The residual still has the canceling signal subtracted from it though. The feedback delay can be adjusted to give the best cancellation when the plant delay is uncertain. Obtaining the impulse response with the analyzer in the lab usually give a good indication of the delay—the time of the first peak corresponds to the delay.

The two filter configuration is much less sensitive to the equalizer than the single filter equalizer due to a good noise sample always being present just before the inversion process. In the one filter case, an equalized version of the noise was present at the inverter. This example was with plant of 100 weights and an equalizer of 32 and then 100 weights. A different plant with a more over damped step response, shorter transport delay, longer equalizer or noise with different statistics may make the one filter case practical.

Figure 7:
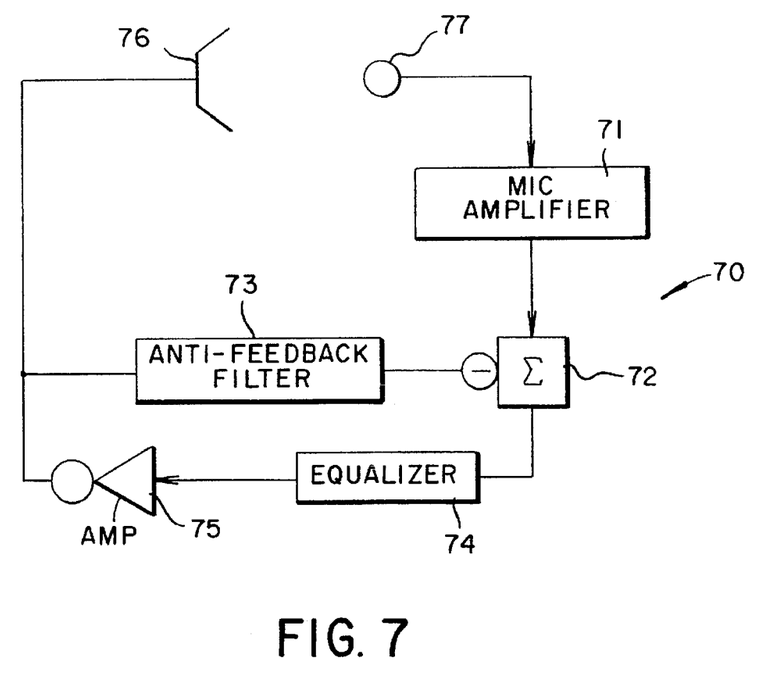
FIG. 7 shows a canceller with plant equalization.

A simple low cost canceller with plant equalizations is shown in FIG. 7 as 70 with microphone 77, amplifier 71, summer 72, filter 73, equalizer 74 and adjustable gain amplifier 75.

Figure 8:
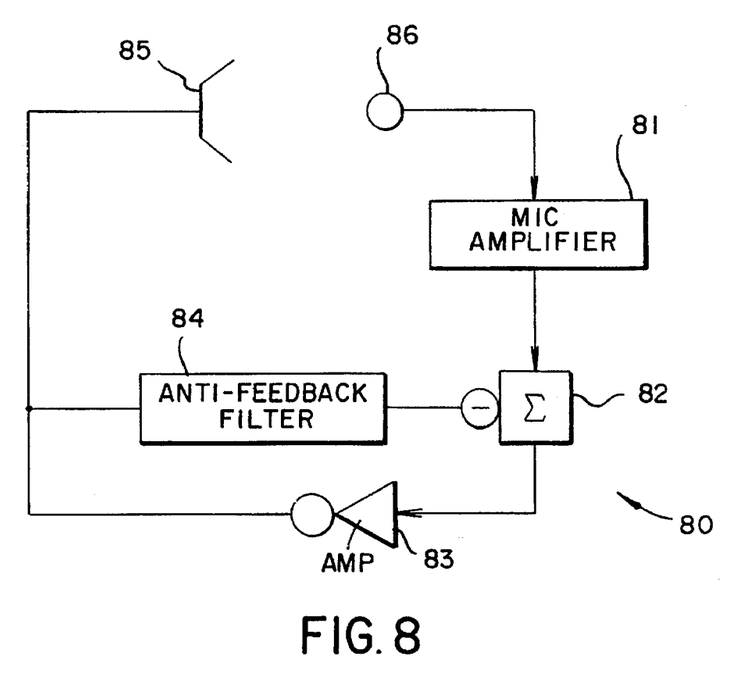
FIG. 8 shows a diagram of a basic low cost canceller.
Figure 9:
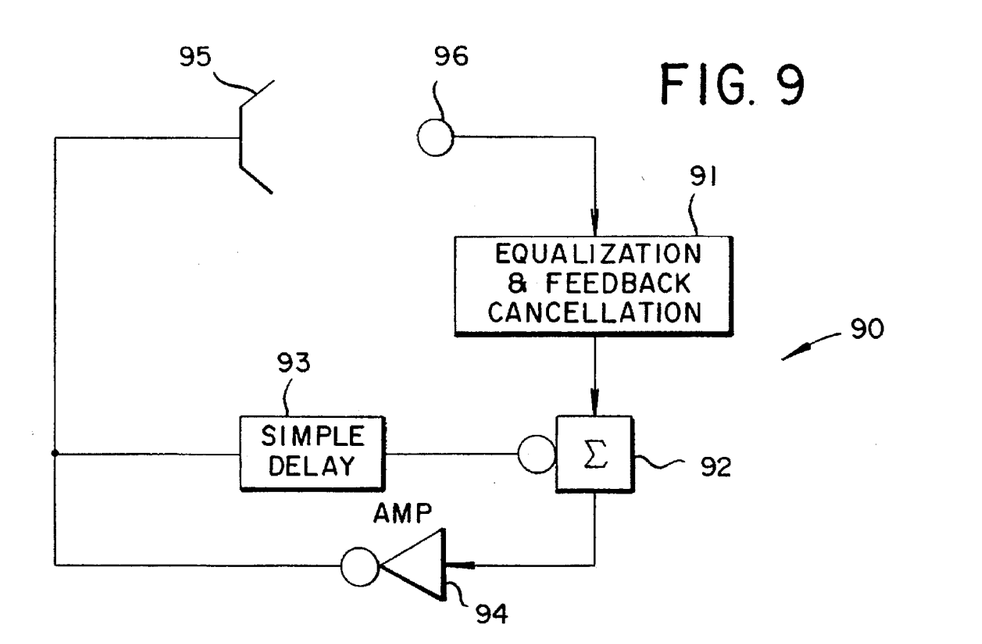
FIG. 9 shows a single filter low cost canceller with equalization.

FIG. 8 shows basic low cost canceller 80 with microphone 86, amplifier 81, summation 82, filter 84 and amplifier 83. The use of a single filter low cost canceller with equalization is shown in FIG. 9 as 90 with equalization feedback cancellation 91, summer 92, delay 93, amplifier 94, actuator 95 and microphone 96.

Figure 10:
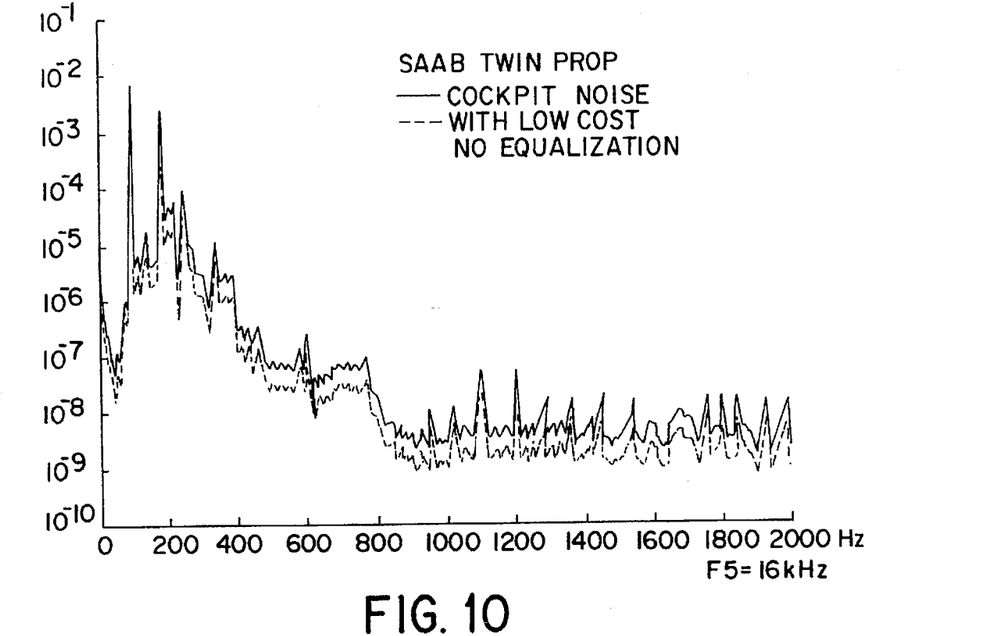
FIG. 10 shows a plot of random noise cancellation in a SAAB twin prop.

FIG. 10 shows the plot for a prop plane noise where the gain was adjusted for optimum performance once the feedback filter was loaded. The peak reduction was 10 dB for the lowest harmonic and approximately 5 dB for the next lowest.

Figure 11:
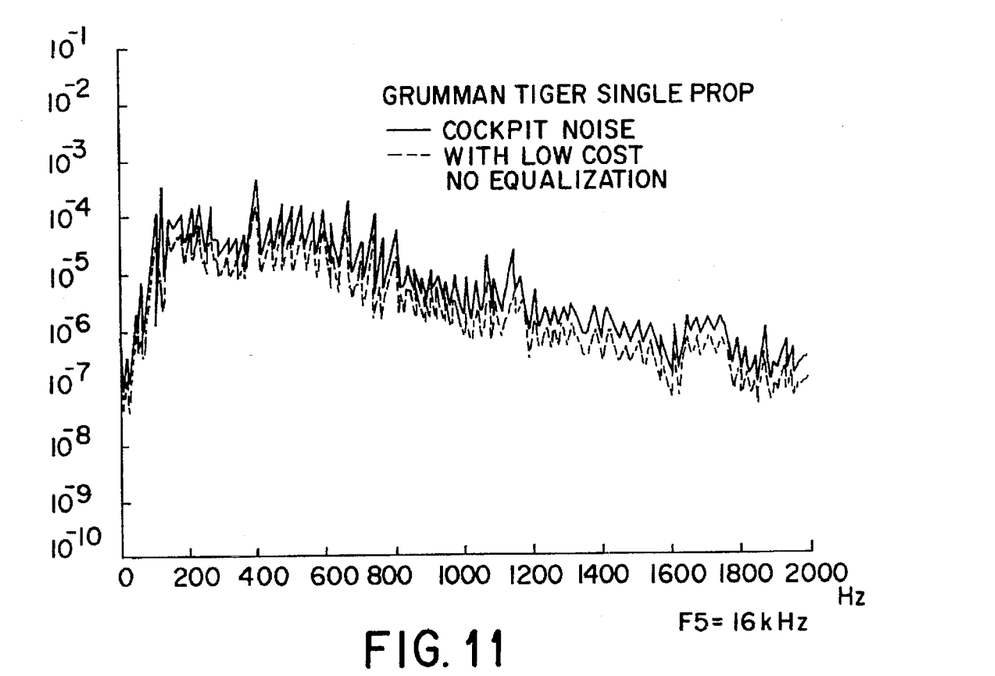
FIG. 11 shows the plot of random noise cancellation in a Grumman Tiger single prop.

FIG. 11 shows the plot for a single engine having a broader spectrum without high peaks at low frequency. The reduction was 3–5 dB across the spectrum.

We claim:

1. A low cost active noise control system for canceling band-limited random noise in a physical plant, comprising:

a speaker means which, responsive to a control signal, generates a sound field which operates to cancel said band-limited random noise thereby producing a residual noise equal to the difference of said sound field and said band-limited random noise;

an error sensing means which senses the residual noise and generates a residual signal representative of said residual noise;

a controller means which comprises a single inverting amplifier means having an adjustable gain and which, responsive to a corrected signal, generates said control signal;

a compensation means which, responsive to said control signal, produces a compensation signal; and a subtraction means which subtracts said compensation signal from said residual signal to produce said corrected signal.

2. A system as in claim 1, wherein said controller means includes an equalization filter means.

3. A system as in claim 2, wherein said controller means also includes a single inverting filter means with adjustable gain, said filter and equalizing means adapted to compensate for delays that are too long for random cancellation.

4. A system as in claim 2, wherein said error sensing means is a microphone.

5. A system as in claim 1, which further comprises:

an equalization filter which receives said residual signal and produces an equalized residual signal and which compensates for a frequency-amplitude response of said physical plant, wherein said compensation signal is subtracted from said equalized residual signal to produce said corrected signal.

6. A system as in claim 5, wherein said compensation means is a delay means which causes a delay substantially equal to a delay introduced by a combination of said equalization filter and said physical system.

7. A system as in claim 1, which further comprises:

an equalization filter which receives said control signal and produces an equalized control signal, wherein said equalization filter compensates for a frequency-amplitude response of said physical plant and wherein said speaker means is responsive to said equalized control signal.

8. A system as in claim 7, wherein said compensation means is a delay means which causes a delay substantially equal to a delay introduced by a combination of said equalization filter and said physical system, and wherein said subtraction means subtracts said compensation signal from said residual signal to produce said corrected signal.

9. A system as in claim 1, wherein said compensation means is a digital filter having a response substantially equal to a response of said physical plant in the frequency range of said band-limited random noise.

10. A method for cancelling band limited random noise in a physical plant, comprising the steps of:

generating a control signal by inverting and adjusting the gain of a corrected signal;

generating a compensation signal in response to said control signal;

subtracting said compensation signal from a residual signal to produce said corrected signal generating a sound field in response to said control signal, wherein said sound field operates to cancel said band-limited random, noise thereby producing a residual noise;

sensing the residual noise; and generating said residual signal which is representative of the residual noise.

11. A method as in claim 10, wherein the step of sensing the residual noise is done with microphones.

12. The method of claim 10, further comprising the step of:

equalizing said residual signal, thereby compensating for a frequency-amplitude response of said physical plant, to produce an equalized residual signal, wherein said compensation signal is subtracted from said equalized residual signal to produce said corrected signal.

13. The method of claim 12, wherein said compensation signal is obtained by delaying said control signal by an amount substantially equal to a delay introduced by a combination of an equalization filter which produces said equalized residual signal and said physical plant.

14. The method of claim 10, further comprising the step of:

equalizing said control signal, thereby compensating for a frequency-amplitude response of said physical plant, to produce an equalized control signal, wherein said compensation signal is generated from said equalized control signal and is subtracted from said residual signal to produce said corrected signal.

15. The method of claim 14, wherein said compensation signal is obtained by delaying said control signal by an amount substantially equal to a delay introduced by a combination of an equalization filter which produces said equalized control signal and said physical plant.

16. The method of claim 10, wherein said compensation signal is obtained by passing said control signal through a digital filter with a response substantially equal to a response of said physical plant in the frequency range of said band-limited random noise.

\* \* \* \* \*